United States Patent [19]
Parkin

[11] Patent Number: 5,936,293
[45] Date of Patent: Aug. 10, 1999

[54] HARD/SOFT MAGNETIC TUNNEL JUNCTION DEVICE WITH STABLE HARD FERROMAGNETIC LAYER

[75] Inventor: Stuart Stephen Papworth Parkin, San Jose, Calif.

[73] Assignee: International Business Machines Corporation, Armonk, N.Y.

[21] Appl. No.: 09/012,742

[22] Filed: Jan. 23, 1998

[51] Int. Cl.[6] .................................................. H01L 29/82
[52] U.S. Cl. ...................... 257/422; 257/421; 365/157; 365/158
[58] Field of Search ................................ 257/421–427; 360/113; 365/157, 158

[56] References Cited

U.S. PATENT DOCUMENTS

| | | | |
|---|---|---|---|
| 3,623,038 | 11/1971 | Franklin et al. | 340/174 TF |
| 5,018,037 | 5/1991 | Krounbi et al. | 360/113 |
| 5,390,061 | 2/1995 | Nakatani et al. | 360/113 |
| 5,416,353 | 5/1995 | Kamiguchi et al. | 257/421 |
| 5,432,734 | 7/1995 | Kawano et al. | 365/158 |
| 5,436,777 | 7/1995 | Soeya et al. | 360/113 |
| 5,465,185 | 11/1995 | Heim et al. | 360/113 |
| 5,528,440 | 6/1996 | Fontana et al. | 360/113 |
| 5,532,892 | 7/1996 | Nix et al. | 360/113 |
| 5,629,922 | 5/1997 | Moodera et al. | 369/126 |
| 5,664,316 | 9/1997 | Chen et al. | 29/603.08 |
| 5,713,122 | 2/1998 | Aboaf et al. | 29/603.08 |
| 5,729,410 | 3/1998 | Fontana, Jr. et al. | 360/113 |
| 5,801,984 | 9/1998 | Parkin | 365/158 |

FOREIGN PATENT DOCUMENTS

WO 95/10123  4/1995  WIPO ............................ H01L 43/08

OTHER PUBLICATIONS

J. M. Daughton, "Magnetic Tunneling Applied to Memory", *Journal of Applied Physics*, vol. 81, No. 8, Apr. 15, 1997, pp. 3758–3763.

W. J. Gallagher et al., "Microstructured Magnetic Tunnel Junctions", *Journal of Applied Physics*, vol. 81, No. 8, Apr. 15, 1997, pp. 3741–3746.

M. Julliere, "Tunneling Between Ferromagnetic Films", *Physics Letters*, vol. 54A, No. 3, Sep. 8, 1975, pp. 225–226.

K. P. Kämper et al., "$CrO_2$—A New Half–metallic Ferromagnet?", *Physical Review Letters*, vol. 59, No. 24, Dec. 14, 1987, pp. 2788–2791.

K. Matsuyama et al., "Fabrication of Microstructured Magnetic Tunneling Valve Junction", *IEEE Transactions on Magnetics*, vol. 31, No. 6, Nov. 1995, pp. 3176–3178.

J. S. Moodera et al., "Large Magnetoresistance at Room Temperature in Ferromagnetic Thin Film Tunnel Junctions", *Physical Review Letters*, vol. 74, No. 16, Apr. 17, 1995, pp. 3273–3276.

J. S. Moodera et al., "Ferromagnetic–insulator–ferromagnetic Tunneling: Spin–dependent Tunneling and Large Magnetoresistance in Trilayer Junctions", *Journal of Applied Physics*, vol. 79, No. 8, Apr. 15, 1996, pp. 4724–4729.

*Primary Examiner*—Jerome Jackson, Jr.
*Assistant Examiner*—B Wm. Baumeister
*Attorney, Agent, or Firm*—Thomas R. Berthold

[57] ABSTRACT

A magnetic tunnel junction (MTJ) of the type using soft (low magnetic coercivity) and hard (high magnetic coercivity) ferromagnetic layers separated by an insulating tunnel barrier (a hard/soft MTJ device) is stable without loss of magnetization after repeated cycling of its magnetic state. The MTJ device is based on the discovery that the mechanism of demagnetization in a hard/soft MTJ device is via coupling of the hard ferromagnetic layer to the soft ferromagnetic layer via the formation and motion of domain walls in the soft ferromagnetic layer. The MTJ device includes adjacent ferromagnetic structures that provide a transverse biasing magnetic field to the soft ferromagnetic layer. The transverse biasing field permits coherent rotation of the magnetic moment of the soft ferromagnetic layer without the formation of magnetic domains when suitable switching fields are applied. The elimination of the effect of domain walls in the soft ferromagnetic layer can also be achieved by an MTJ device with the soft ferromagnetic layer having a larger surface area than the hard ferromagnetic layer so that any domain walls are concentrated at the edges of the soft ferromagnetic layer and thus have minimal effect on the hard ferromagnetic layer.

24 Claims, 9 Drawing Sheets

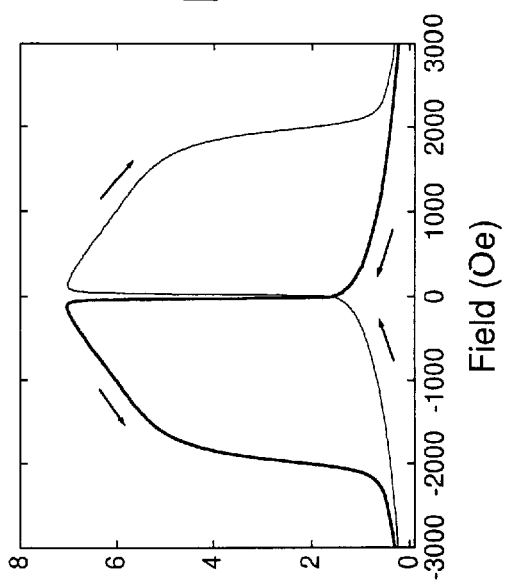
Fig. 1C
Fig. 1D
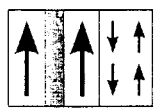
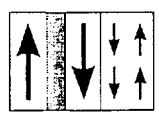
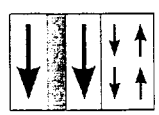
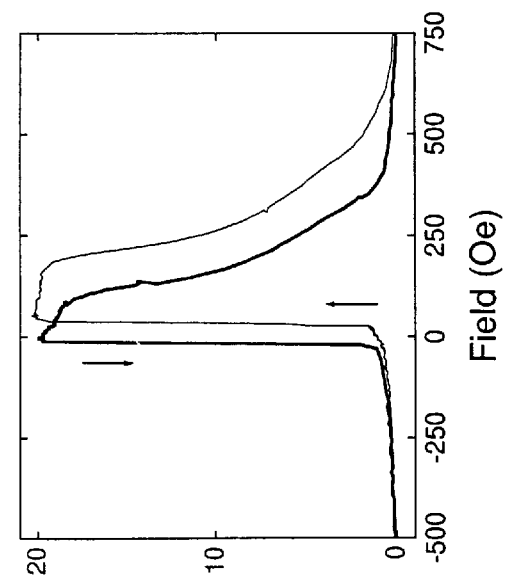
Fig. 1A
Fig. 1B

HARD/SOFT MAGNETIC TUNNEL JUNCTION DEVICE WITH STABLE HARD FERROMAGNETIC LAYER

STATEMENT OF GOVERNMENT RIGHTS

The United States Government has a paid-up license in this invention and the right in limited circumstances to require the patent owner to license others on reasonable terms as provided for by the terms of Contract No. MDA972-96-C-0030 awarded by the Defense Advanced Research Projects Agency.

TECHNICAL FIELD

This invention relates to magnetic tunnel junction (MTJ) devices, such as those used as memory cells in nonvolatile magnetic memory arrays. More particularly the invention relates to a MTJ device that uses hard and soft ferromagnetic layers but that does not suffer from demagnetization as a result of repeated cycling of its magnetic state.

BACKGROUND OF THE INVENTION

A magnetic tunnel junction (MTJ) is a sandwich of two ferromagnetic metal layers separated by a thin insulating tunnel barrier. The tunneling resistance between the two ferromagnetic metal layers depends on the relative orientation of their magnetization directions (magnetic moments). The simplest form of a MTJ is one comprised of two ferromagnetic layers with different magnetic coercivities, which will be referred to as a "hard/soft" MTJ. One of the ferromagnetic layers, the fixed or "hard" layer, has a magnetic coercivity considerably greater than any magnetic field to which it will be subjected in use. The other ferromagnetic layer, the "soft" layer, has a lower coercivity such that its magnetic moment can be reversed by application of a small magnetic field in operation of the MTJ device. Thus, the MTJ device can operate as a memory storage element or cell wherein the two states of the memory cell correspond to the cases where the magnetic moments of the two ferromagnetic layers are aligned either parallel to one another or antiparallel to one another.

One problem with a hard/soft MTJ is that repeated reversal of the soft ferromagnetic layer's magnetization can demagnetize the hard ferromagnetic layer and thus erase the MTJ's memory. One way to form a stable MTJ device is to replace the hard ferromagnetic layer with an exchange-biased ferromagnetic layer, wherein one of the ferromagnetic layers is "pinned" by interface exchange coupling to an antiferromagnetic layer. Such a device will be referred to as an "exchange-biased" MTJ to distinguish it from a hard/soft MTJ. An exchange-biased MTJ is described in IBM's U.S. Pat. No. 5,650,958. The magnetization of the exchange-biased ferromagnetic layer in this exchange-biased MTJ is stable at least to $10^7$ cycles. However, the use of an exchange-biased ferromagnetic layer increases the complexity of the MTJ device and limits the temperature range over which the device can be subjected because of the relatively low blocking temperature of the antiferromagnetic layer, which is typically Mn-Fe. A hard/soft MTJ device, on the other hand, can operate over a much greater temperature range and is simpler to fabricate. In addition, a hard/soft MTJ device has an important advantage in that the magnetic moment of the hard ferromagnetic layer can be set in any arbitrary direction by merely applying a field sufficiently large to magnetize the hard ferromagnetic layer. This feature is described in IBM's pending application Ser. No. 08/757,175 filed Nov. 27, 1996.

Thus, what is needed is a hard/soft MTJ device that is able to withstand repeated magnetic cycling or reversals of its soft ferromagnetic layer.

SUMMARY OF THE INVENTION

The invention is based on the discovery that the mechanism of demagnetization in a hard/soft MTJ is via coupling of the hard ferromagnetic layer to the soft ferromagnetic layer via the formation and motion of domain walls in the soft ferromagnetic layer. This has been demonstrated by applying a field larger than the coercive field of the soft ferromagnetic layer and rotating this constant magnitude field in the plane of the MTJ. No demagnetization of the hard layer was observed, within experimental error, for up to $\sim 10^6$ field rotations for a hard/soft MTJ, while the same MTJ device became completely demagnetized when the field was cycled (i.e., reversed) the same number of times.

As a result of this discovery, a hard/soft MTJ device has been invented wherein the moment of the soft ferromagnetic layer can be rotated without the formation of domain walls. The hard/soft MTJ device includes adjacent ferromagnetic structures to provide a transverse biasing magnetic field to the soft ferromagnetic layer. The transverse biasing field permits coherent rotation of the magnetic moment of the soft ferromagnetic layer without the formation of magnetic domains when suitable switching fields are applied. The elimination of the effect of domain walls in the soft ferromagnetic layer can also be achieved by forming the soft ferromagnetic layer with a larger surface area than the hard ferromagnetic layer, in particular by forming the soft ferromagnetic layer to be longer than the hard ferromagnetic layer along one of its directions so that any domain walls are concentrated at the edges of the soft ferromagnetic layer and thus provide minimal effect on the hard ferromagnetic layer.

For a fuller understanding of the nature and advantages of the present invention, reference should be made to the following detailed description taken together with the accompanying figures.

BRIEF DESCRIPTION OF THE DRAWING

FIG. 1 shows the magnetization (FIGS. 1A and 1C) and magnetoresistance (FIGS. 1B and 1D) loops of exchange-biased and hard/soft MTJ devices, respectively.

DESCRIPTION OF PREFERRED EMBODIMENTS

Figure 2:
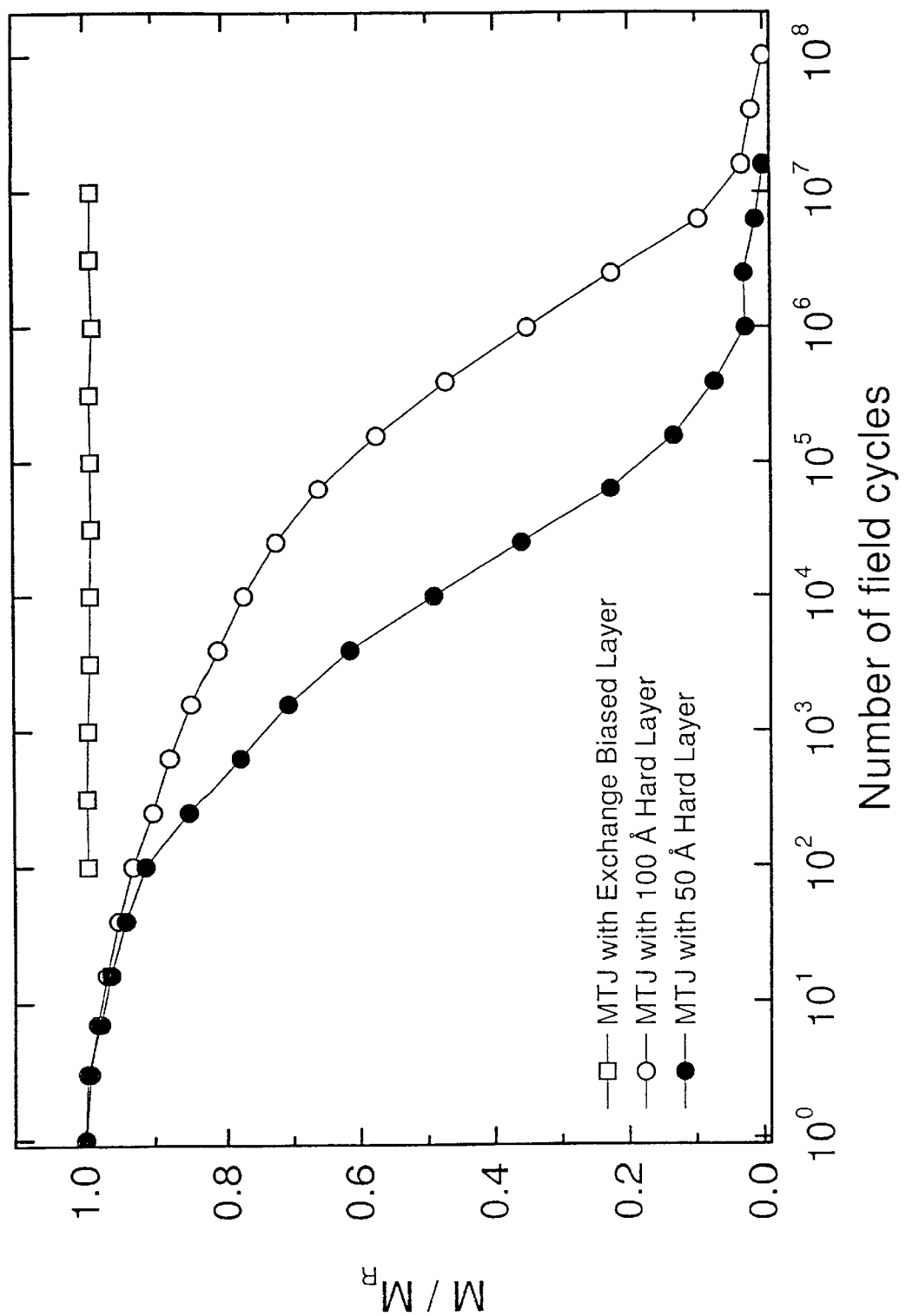
FIG. 2 shows the change in remanent magnetization, on a logarithmic scale, of the reference or fixed ferromagnetic layers with cycling of the soft or free ferromagnetic layers in two hard/soft MTJs and one exchange-biased MTJ, with the curves being normalized by the remanent magnetization $M_R$ set with 5000 Oe before cycling.

In a MTJ, when the magnetizations of the two ferromagnetic layers are antiparallel, the probability of electron tunneling is low and the resistance is high because, for a given spin state in one ferromagnetic layer, there are few of the same spin states in the other ferromagnetic layer. Inversely, when the two magnetizations are parallel, the tunneling probability is high and the resistance is low. The antiparallel and parallel arrangements of the magnetizations in a MTJ may represent the two states of a bit. Reading the information only requires measuring the resistance. Writing the information involves switching the free ferromagnetic layer's magnetization, ideally without affecting the reference or fixed layer's magnetization. In a hard/soft MTJ, the hard ferromagnetic layer is the reference or fixed layer and the soft ferromagnetic layer is the free layer. Coupling between the ferromagnetic layers may eventually demagnetize the reference layer and effectively erase the memory of the MTJ.

A successful MTJ memory device requires the stability of the reference layer over millions of magnetization reversals of the free layer. In an exchange-biased MTJ, shifting of the hysteresis loop away from zero field by exchange biasing can stabilize the reference layer. The magnetization of the reference layer is pinned to an adjacent antiferromagnet through an interfacial exchange interaction, which effectively acts as an internal field on the reference layer and must be overcome in order to switch the layer. In a hard/soft MTJ, the hysteresis loop of the reference layer can also be widened or magnetically "hardened" by alloying it. The stability of both exchange-biased and hard reference layers was considered by following the magnetization of the reference layers after switching the free layers by cycling a magnetic field between appropriate limits. These structures behaved quite differently. Whereas the magnetization of an exchange-biased reference layer was stable at least to $10^7$ cycles, the magnetization of a hard reference layer generally decayed logarithmically with the number of cycles and was eventually completely demagnetized.

The samples were grown by dc magnetron sputtering in $10^{-3}$ torr of Ar after reaching an ultra-high vacuum of $10^{-9}$ torr. The tunneling barrier was comprised of an aluminum oxide which was formed by depositing Al, followed by plasma oxidation in 0.1 torr of $O_2$. Since only the Al thickness was known and not the actual aluminum oxide thickness, the insulating tunnel barrier thickness was quoted as the Al thickness. (The thickness typically increases by 30% after plasma oxidation.) The samples were grown on Si(100) wafers with a 5000 Å thick $SiO_2$ layer for electrical isolation between junctions. A series of in situ contact masks defined ten (80 $\mu$m)$^2$ junctions with leads and contacts for four-point resistance measurements, and simultaneously defined 1.5 mm by 6.0 mm areas for magnetization measurements. Thus, complementary measurements were possible on the same structure, albeit on different areas of the structure. All measurements were performed at room temperature.

The magnetization and magnetoresistance of an exchange-biased MTJ and a hard/soft MTJ are shown in FIGS. 1A–1B and FIGS. 1C–1D, respectively. The corresponding magnetization directions are shown above in FIGS. 1A and 1C in schematic cross-sections of each structure. The thin dark layer represents the insulating tunneling barrier. In the exchange-biased MTJ device, the antiferromagnetic layer of Mn-Fe is represented by a layer with alternating magnetization directions. The arrows in the loops indicate the direction of the field sweep. The magnetoresistance ratio $\Delta R/R_S$ is defined as $[R(H)-R_S]/R_S$, where $R(H)$ is the resistance at a particular field H and $R_S$ is the resistance at saturation, where the magnetizations of the two ferromagnetic layers are parallel. The magnetization was measured with an rf SQUID magnetometer, which senses the total moment and thus superimposes the hysteresis loops of the two layers. In the exchange-biased MTJ device, the reference layer of Co is exchange-biased by Mn-Fe, and its hysteresis loop is shifted toward positive field (FIG. 1A). (The direction of the exchange bias is defined by an external field during the growth.) In the hard/soft MTJ device, the reference layer of $Co_{75}Pt_{12}Cr_{13}$ is observed to switch symmetrically at a higher field of ~2000 Oe, as compared to the free Co layer which switches at ~50 Oe (FIG. 1C). As shown in the corresponding magnetoresistance curves, FIGS. 1B and 1D, both MTJ devices show a maximum in resistance near zero field where the free and reference layers are antiparallel, and a minimum at high fields where the two layers are parallel. In general, it is possible to achieve higher magnetoresistance with an exchange-biased reference layer than with a hard reference layer largely because the former has a more uniform magnetization than the latter.

To simulate the writing of bits, the magnetization of the free layer was repeatedly reversed with a magnetic field large enough to saturate the free layer (±100 Oe for the exchange-biased structure and ±200 Oe for the hard/soft structure), but smaller than the field necessary to reverse the reference layer. The remanent state of the reference layer was then sensed by the magnetization. (Alternatively, the state can be sensed by the resistance.) Both the cycling and sensing may be done in the SQUID magnetometer; however, the large inductance of the superconducting magnet in the magnetometer limits the rate at which the field can be cycled. In order to reach a million cycles within a reasonable time, the samples were cycled in a resistive coil which is part of a resonant circuit tuned to 10 kHz.

A dramatic difference in the stability of exchange-biased and hard reference layers is evident in the magnetization decay curves of FIG. 2. The exchange-biased reference layer is stable at least to $10^7$ cycles, which is equivalent to about one write cycle every second for a year. In contrast, the hard reference layers have a slow logarithmic decay toward demagnetization. The form of the decay before complete demagnetizaton is approximately $1-[\log(N/N_0)]^2$, where N is the number of cycles and $N_0$ is an adjustable parameter. The decay is independent of the frequency of the cycling at least to 10 kHz, as verified by cycling at 500 Hz and 50 Hz in the electromagnet and to $10^3$ cycles in the superconducting magnet. Frequency independence implies that the effect is not due to eddy current heating. However, when the extrinsic cycling time approaches the intrinsic magnetic switching time (~ns), the decay is expected to become frequency dependent. The decay is observed to be strongly dependent on the thickness of the hard layer. Increasing the thickness from 50 Å to 100 Å delays the demagnetization by an order of magnitude in number of cycles. The rate of decay continues to decrease for thicknesses at least to 200 Å. While there is no observable change in the coercive fields of the hard layers beyond 100 Å, the magnetizations of the layers increases linearly with thickness, and thus the thicker layers are more difficult to demagnetize. There is also an increase in the coercive fields of the free layers for increasing thickness of the hard layer, from 20 Oe with a 50 Å hard layer to 54 Oe with a 200 Å hard layer. The thicker hard layers may be rougher, producing more pinning sites for magnetic domains in the free layer and increasing the coercivity of the free layer.

Figure 3:
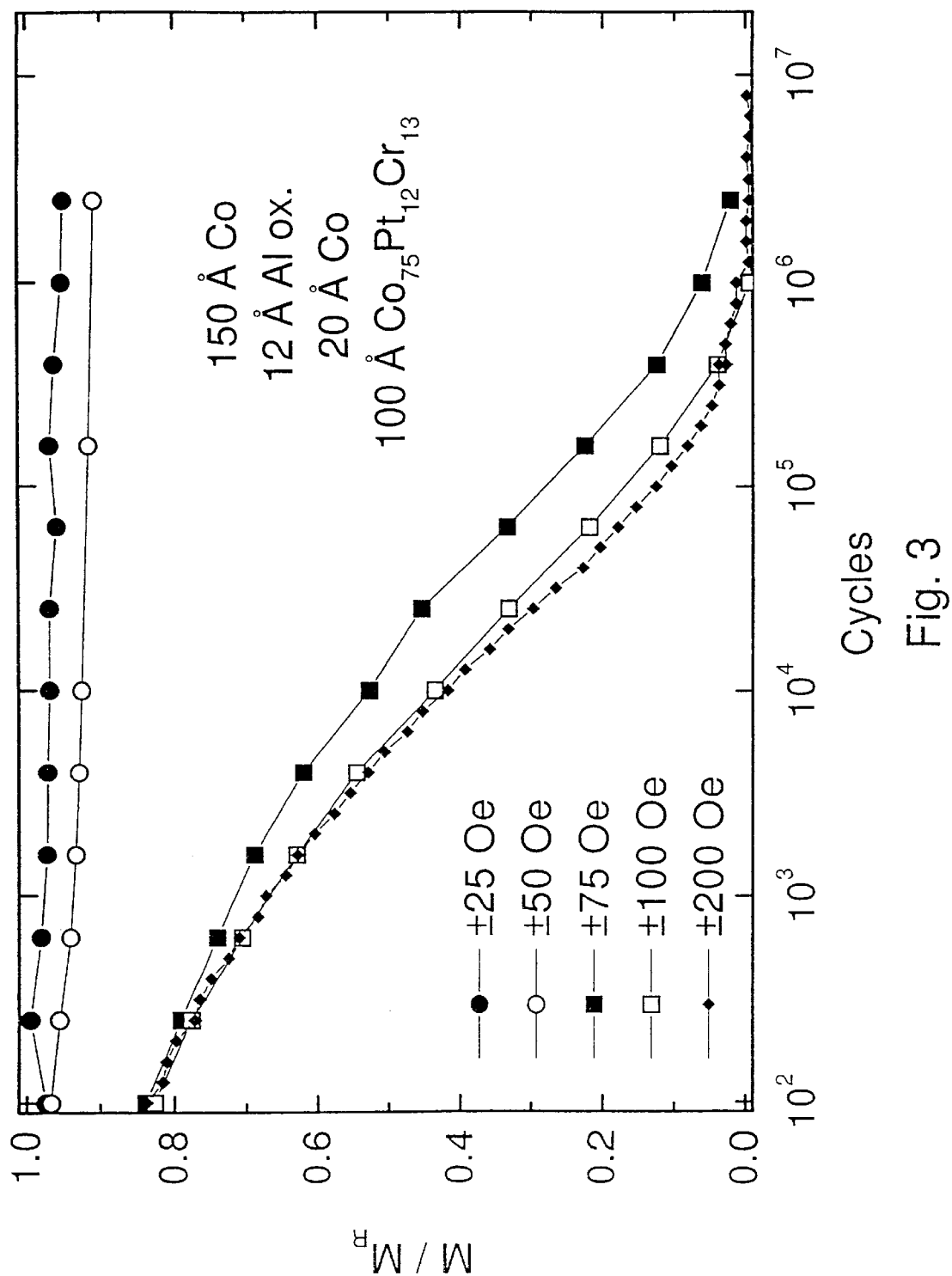
FIG. 3 shows the dependence of the hard ferromagnetic layer magnetization decay on the amplitude of cycling, and illustrates that the 20 Å of Co at the lower interface which enhances the magnetoresistance does not alter the threshold for decay.

To explore further the mechanism for the decay, a hard/soft MTJ structure was cycled for different field amplitudes. As shown in FIG. 3, there was a sudden onset of decay when the field amplitude exceeded the coercive field (~50 Oe) of the free layer. The decay was weakly dependent on the amplitude beyond the threshold, slower for ±75 Oe than for ±200 Oe, suggesting that ±75 Oe does not completely rotate the magnetization of the free layer. Additional evidence that the decay of the hard layer is induced by coupling with the free layer is that a homogenous hard layer alone is stable even when cycled with ±200 Oe. The effect is therefore distinct from magnetization creep, i.e., the slow growth of domains of opposite magnetization in homogenous layers cycled with a field along the magnetic hard axis and a constant field along the easy axis.

Figure 4:
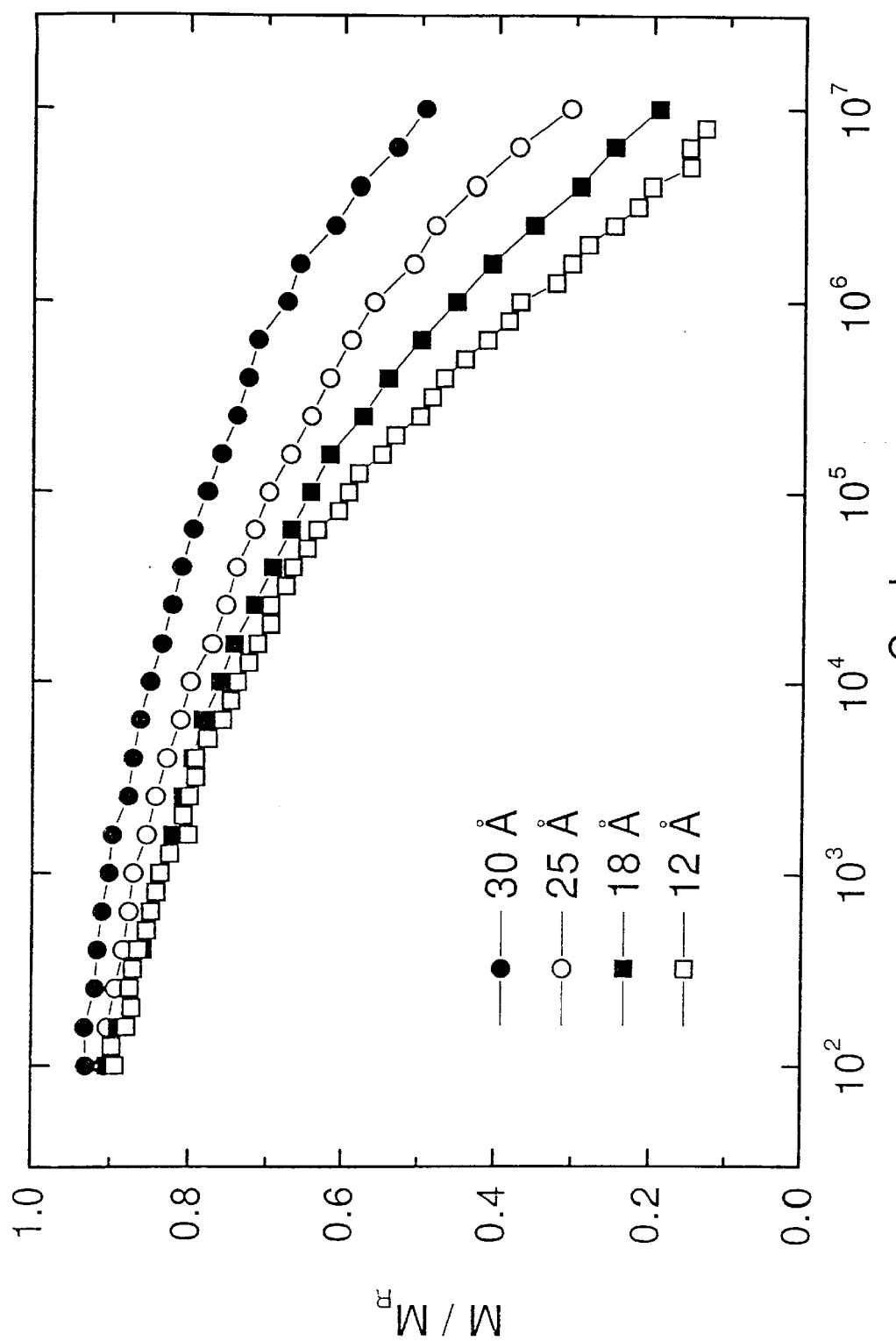
FIG. 4 shows the variation in hard ferromagnetic layer magnetization decay rate with deposited thickness of the aluminum interface for a structure of 150 Å $Co_{75}Pt_{12}Cr_{13}$, t Al oxide, and 150 Å Co, where t is the variable thickness.

Coupling between thin ferromagnetic layers has been studied extensively, both experimentally and theoretically. If the layers are separated by a conductor, there is an exchange coupling which oscillates between ferromagnetic and antiferromagnetic as a function of the conductor thickness. In addition, there is magnetostatic coupling, which dominates the interaction between ferromagnetic layers separated by an insulating layer. Magnetostatic or "orange-peel" coupling arises from correlated roughness between the two layers. Along the interface, the magnetic dipole interaction will favor the alignment of the magnetization in a peak of one layer with the adjacent trough in the other layer. The coupling is analogous to permanent magnets in a line favoring an arrangement wherein opposite poles are next to each other and the magnetizations are all in the same direction. It is essential that the roughness is correlated, i.e., a peak in the bottom layer corresponds to a peak in the layer immediately above it. The coupling energy J depends on a number of parameters:

$$J \propto \frac{A^2}{\lambda} M_1 M_2 \exp\left(-2\pi\sqrt{2}\frac{t}{\lambda}\right),$$

where A and $\lambda$ are the amplitude and wavelength of the roughness, $M_1$ and $M_2$ are the magnetizations of the two layers, and t is the thickness of the spacer layer. The coupling is manifested as a small shift of the free layers' hysteresis loop away from zero field by a few Oe. It is difficult to control the roughness parameters, and the magnetizations are intrinsic properties of the materials, but the thickness of the insulating layer can be varied systematically to study the contribution of magnetostatic coupling to the decay. The results are shown in FIG. 4. Although only the thickness of the unoxidized aluminum is controlled, one can infer by the exponential rise in resistance that the aluminum oxide is thicker for increasing aluminum thickness and constant oxidation time (4 minutes). Correspondingly, as shown in FIG. 4, there is a systematic increase in the decay rate with decrease in insulator thickness. However, the mechanism for the decay cannot be caused exclusively by magnetostatic coupling induced by correlated roughness. If both the free and reference layers are single domain, magnetostatic coupling cannot produce a field large enough to switch the reference layer at once.

Figure 5:
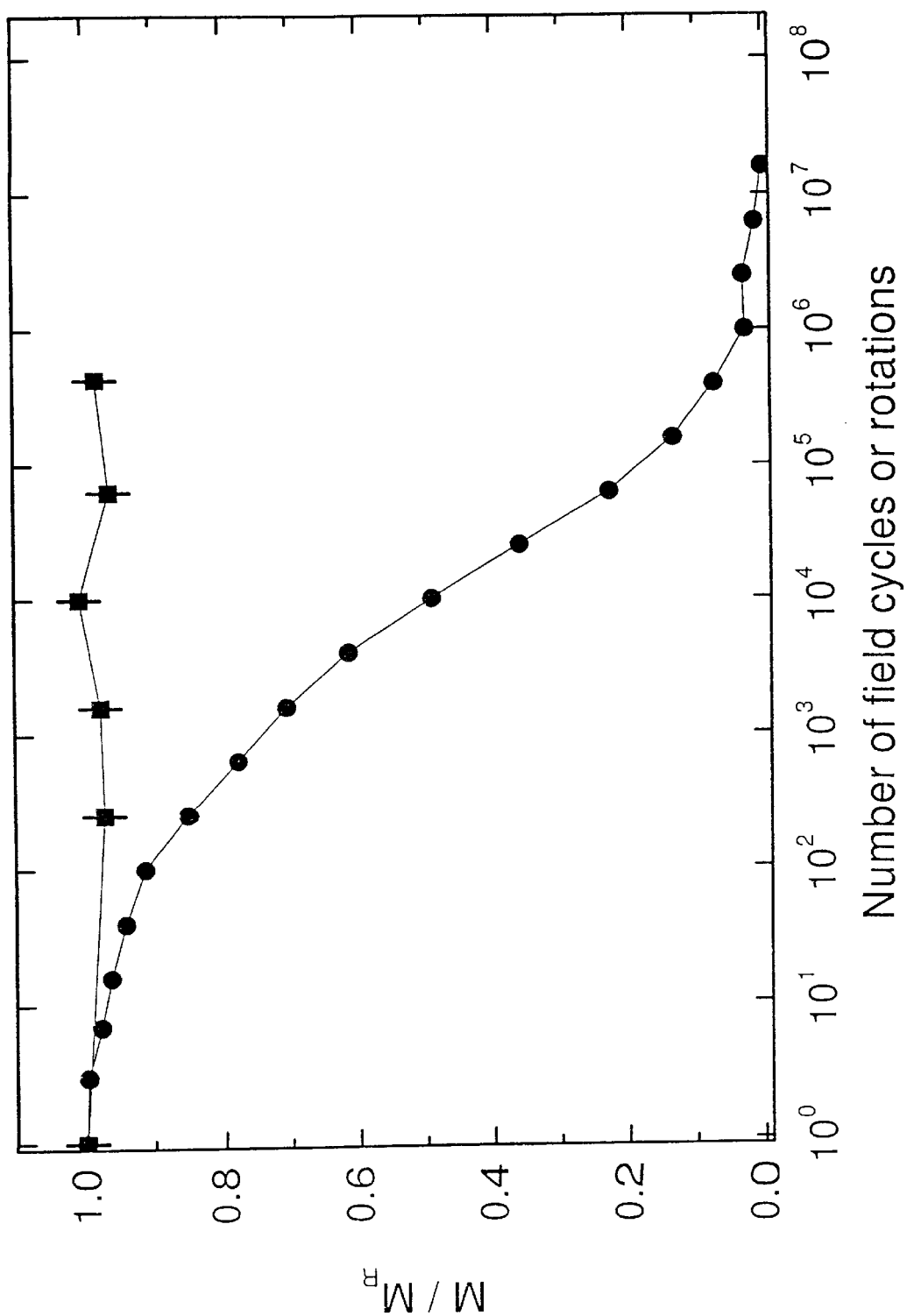
FIG. 5 shows the change in remanent magnetization, on a logarithmic scale, of the hard ferromagnetic layer of the same sample of FIG. 2 with cycling (filled circles) and rotation (filled squares) of the soft ferromagnetic layer, with the curves being normalized by the remanent magnetization $M_R$ set with 5000 Oe before cycling.

It is possible to distinguish the mechanism of magnetization decay of a hard/soft MTJ device via magnetostatic coupling of the hard/soft layers from that via an alternate possible mechanism of magnetic domain wall demagnetization fields as follows. If a sufficiently large field is applied to saturate the magnetic moment of the free layer and then this field is rotated about the plane of the sample, the saturated moment of the free layer will rotate with respect to that of the moment of the hard layer, and no domain walls will be formed. Since there are no magnetic domain walls in the free layer during this field rotation, the corresponding demagnetizing fields will be absent. In contrast, the orange-peel or magnetostatic coupling fields will still be present. FIG. 5 compares the magnetization decay in a hard/soft MTJ structure of the form 150 Å Cr/50 Å $Co_{75}Pt_{12}Cr_{13}$/12 Å Al—120 seconds oxygen/150 Å Co/150 Å Al on repeated cycling of the field between ±200 Oe along the direction of the moment of the hard layer (solid circles) with repeated rotation of the sample in a fixed field of +200 Oe (squares). Whereas the moment of the hard layer is completely demagnetized after ~$10^6$ field cycles, the moment is unchanged, to within experimental error, on rotating the field a similar number of times. Note that the error in the measurement of the magnetic moment is greater on rotating the field than on cycling the field. This is because, for the field rotation experiments, the sample has to be removed from a fixture which allows it to be rotated in a constant magnetic field to a fixture which allows the same sample to be supported in the SQUID magnetometer. In contrast, for the field cycling experiments, the same fixture is used to cycle the magnetic field as for the SQUID magnetometer measurements.

The data in FIG. 5 shows that the magnetization decay in the hard/soft MTJ structure is correlated with the presence of magnetic domains in the soft layer as its moment is switched back and forth. Thus, providing the moment of the soft layer is rotated coherently without the formation of magnetic domains, the hard/soft MTJ structure will not exhibit magnetization decay. Thus, hard/soft MTJ devices can be used as magnetic memory storage elements provided there is a means of rotating the soft layer magnetic moment without forming domain walls. This is achieved by the hard/soft MTJ devices described below.

In the preferred embodiment, the MTJ is fabricated with a transverse bias field applied to the hard/soft MTJ using hard ferromagnetic material isolated from the ferromagnetic layers of the MTJ. In a second embodiment, the area of the electrode containing the soft ferromagnetic layer is made larger than that of the electrode containing the hard ferromagnetic layer so that the region of the soft ferromagnetic layer in which there are domain walls is outside the hard ferromagnetic layer.

Figure 6A:
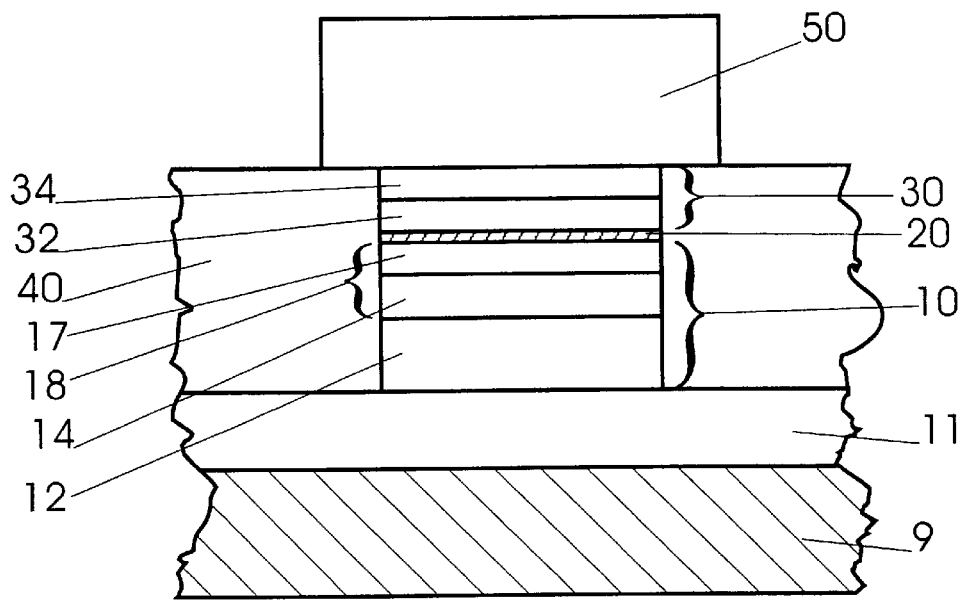
FIGS. 6A–6B show a cross-section view and a top-view, respectively, of the hard/soft MTJ device of the present invention with all of the layers of the MTJ having the same contiguous side edges and with transverse biasing ferromagnetic regions electrically isolated from the MTJ and contact leads.
Figure 6B:
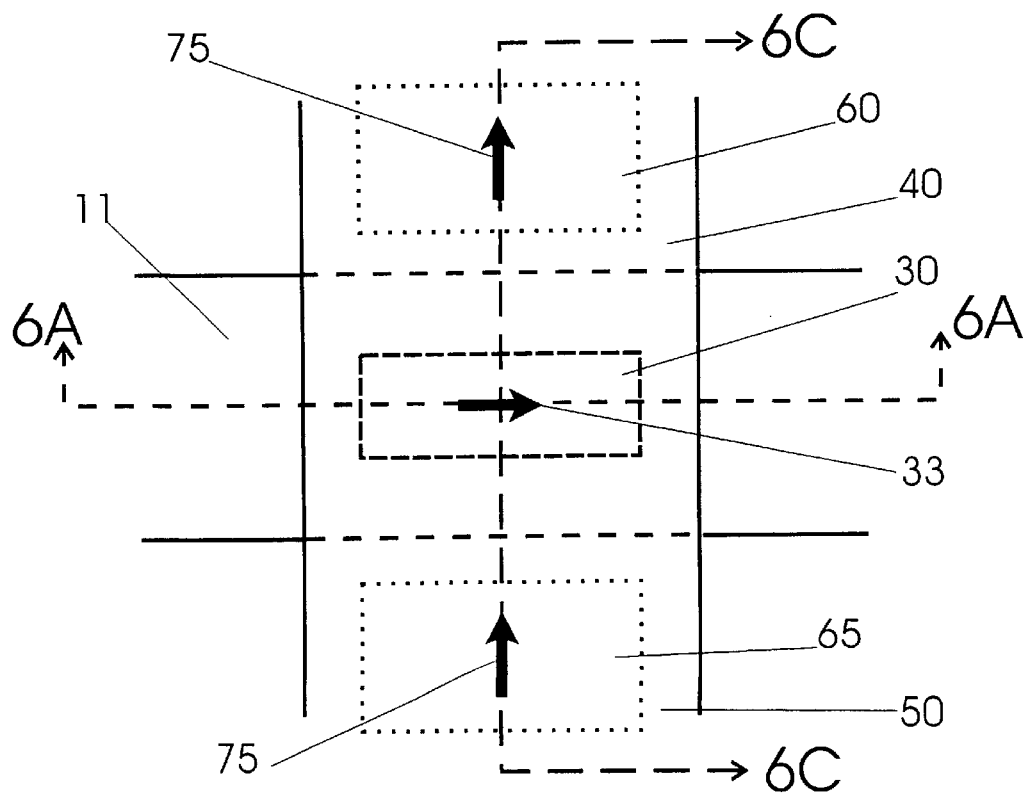
Figure 6C:
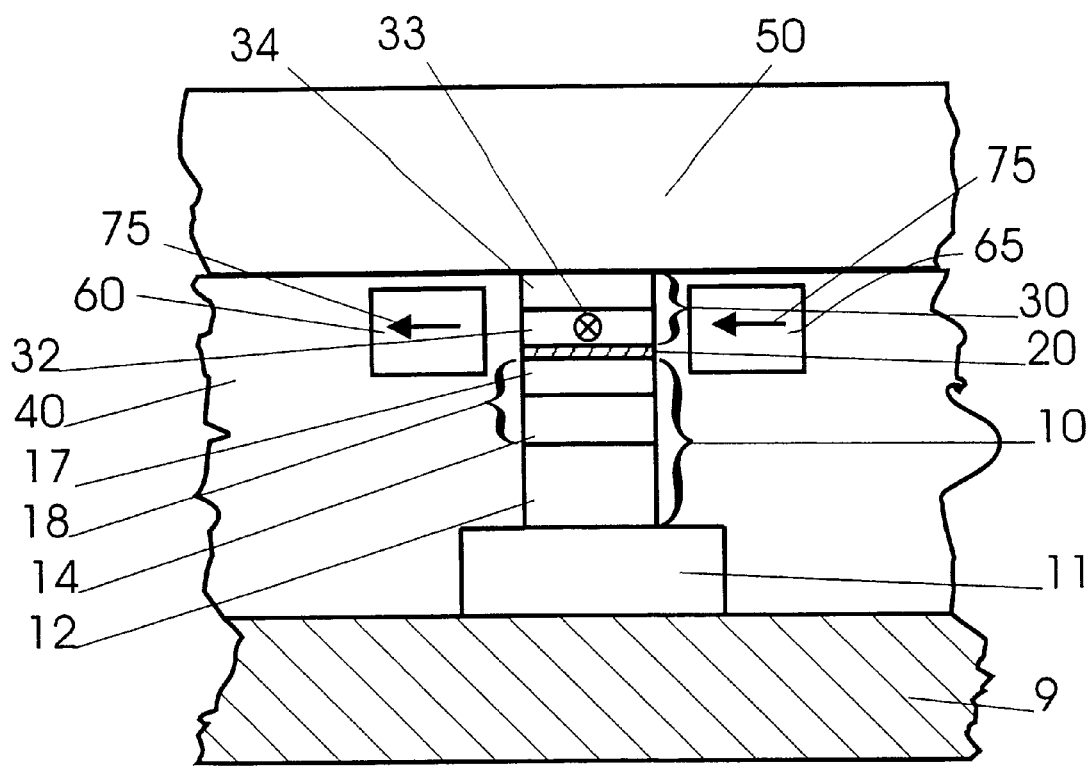
FIG. 6C shows a cross section view of the section 6C—6C taken through FIG. 6B and illustrates the vertical relationship of the transverse biasing ferromagnetic regions electrically isolated from the MTJ and contact leads.

FIGS. 6A–6C illustrate schematically a hard/soft MTJ device suitable for a magnetic memory cell application. The MTJ device, shown in cross-section in FIG. 6A and from a top view in FIG. 6B, includes a base electrode stack 10, an insulating tunnel barrier layer 20, and a top electrode stack 30. The MTJ is formed on substrate 9 and the MTJ device is completed by an insulating layer 40 with a contact hole through it, and a top wiring layer 50 that serves as an electrical lead. Each of the electrode stacks 10, 30 has a ferromagnetic layer located on opposite sides of and in contact with the tunnel barrier layer 20. The base electrode stack 10 formed on substrate 9 includes an electrical lead layer 11 and a seed layer 12 on substrate 9 and a hard ferromagnetic layer 18 (formed as a bilayer of layers 14 and 17) on the seed layer 12. The hard ferromagnetic layer 18 is the fixed or reference layer in the hard/soft MTJ device layer because it is formed of a high-coercivity material whose magnetic moment (magnetization direction) is prevented from rotation in the presence of applied magnetic fields in the desired range of interest for the MTJ device, i.e., the magnetic field caused by the write current applied to the memory cell from the read/write circuitry of the memory array. The top electrode stack 30 includes a soft ferromagnetic layer 32 and a protective layer 34 formed on the soft ferromagnetic layer 32. The soft ferromagnetic layer 32 has a coercivity substantially less than that of hard ferromagnetic layer 18. The magnetic moment of the soft ferromagnetic layer 32 is not fixed, and is thus free to rotate in the presence of an applied magnetic field in the range of interest. Both of the ferromagnetic layers 18 and 32 in electrode stacks 10 and 30, respectively, are fabricated so as to have their easy axes of magnetization generally parallel to one another in the same direction parallel to the length of the bottom wiring layer 11, which is connected to base electrode 10 (FIG. 6B). This direction is shown by the arrow 33 in FIG. 6B. The hard ferromagnetic layer 18 in stack 10 just beneath the tunnel barrier layer 20 has its magnetic moment fixed because the layer is formed of high-coercivity material, i.e., substantially higher than the applied magnetic field in the range of interest. Thus, for magnetic fields of magnitude comparable to those applied to the memory cell during read and write operations of the cell, there is only one possible orientation for the magnetic moment of the hard ferromagnetic layer 18. The soft ferromagnetic layer 32 in top electrode stack 30 is anisotropic in its magnetization properties, but its magnetization direction is not fixed. Rather, its magnetization direction is free to be oriented along either direction of its easy axis by the application of a magnetic field in the desired range.

When the hard/soft MTJ memory cell is in an array of memory cells connected to read/write circuitry, writing to the cell is accomplished by passing write currents through the top 50 and bottom 11 electrode wiring layers (FIGS. 6A–6B) (or by passing current through a combination of these and/or other write and/or bit lines located near the MTJ cell). When a sufficiently large current is passed through both of these lines, the combined magnetic field that they generate in the vicinity of the soft ferromagnetic layer 32 will cause the magnetization direction of the soft ferromagnetic layer 32 to rotate from being parallel to antiparallel (or vice versa) to the magnetization direction of the hard ferromagnetic layer 18. The current levels are selected so that the combined magnetic field they generate exceeds the switching field of the soft ferromagnetic layer 32. This field generated by the combined write currents is selected to be much smaller that the field required to rotate the magnetization of the hard ferromagnetic layer. The write currents do not pass perpendicularly through the MTJ, which has a high resistance compared to the resistances of wiring layers 50 and 11. The MTJ memory cell is read by passing a sense current perpendicularly through the MTJ from the hard ferromagnetic layer 18 through the tunnel junction barrier 20 to the soft ferromagnetic layer 32 (or vice versa). The state of the memory cell is determined by measuring the resistance of the memory cell when a sense current, much smaller than the write currents, is passed perpendicularly through the MTJ. The self-field of this sense or read current is negligible and does not affect the magnetic state of the memory cell.

The probability of tunneling of charge carriers across the tunnel barrier depends on the relative alignment of the magnetic moments of the two ferromagnetic layers. The tunneling current is spin polarized, which means that the electrical current passing from one of the ferromagnetic layers is predominantly composed of electrons of one spin type (spin up or spin down, depending on the orientation of the magnetization of the ferromagnetic layer). The degree of spin polarization of the current is determined by the electronic properties of the magnetic material comprising the ferromagnetic layer at the interface of the ferromagnetic layer with the tunnel barrier. The first ferromagnetic layer thus acts as a spin filter. The probability of tunneling of the charge carriers depends on the availability of electronic states of the same spin polarization as the spin polarization of the electrical current in the second ferromagnetic layer. Usually, when the magnetic moment of the second ferromagnetic layer is parallel to the magnetic moment of the first ferromagnetic layer, there are more available electronic states than when the magnetic moment of the second ferromagnetic layer is aligned antiparallel to that of the first ferromagnetic layer. Thus, the tunneling probability of the charge carriers is highest when the magnetic moments of both layers are parallel, and is lowest when the magnetic moments are antiparallel. When the moments are arranged, neither parallel nor antiparallel, the tunneling probability takes an intermediate value. Thus, the electrical resistance of the MTJ memory cell depends on the spin polarization of the electrical current and the electronic properties of both of the ferromagnetic layers. As a result, the two possible magnetization directions of the free ferromagnetic layer uniquely define two possible bit states (0 or 1) of the memory cell.

The lower electrode 10 includes an underlayer layer 12 of Cr and a bilayer structure that serves as the hard ferromagnetic layer 18. The bilayer is formed from a high-coercivity hard ferromagnetic layer 14 and a thin interface ferromagnetic layer 17. It is not necessary to include the interface layer. The top electrode 30 formed on the alumina tunnel barrier layer 20 is preferably a single layer of $Ni_{40}Fe_{60}$ or Co that serves as the soft ferromagnetic layer 32. A protective capping layer 34 of Ta may be provided on soft ferromagnetic layer 32. An electrical lead layer 50 of Al is formed on the capping layer 34, or on the soft ferromagnetic layer 32 if no protective capping layer is used.

The interface ferromagnetic layer 17 is located at the interface between the hard ferromagnetic layer 14 and the tunnel barrier 20. The interface layer 17 is a material chosen to have a strong spin-filtering effect, for example, Co, a Co-Fe alloy, a Ni-Fe alloy, a Co-Ni alloy, or a Co-Ni-Fe ternary alloy. The presence of the interface layer 17 increases the magnitude of the spin-tunneling magnetoresistance displayed by the MTJ device.

Thus, a suitable structure is obtained wherein the underlayer 12 is formed of 100 Å Cr, the high-coercivity ferromagnetic layer 14 is formed of 150 Å $Co_{75}Pt_{12}Cr_{13}$, the interlace layer 17 is formed of 10 Å Co, and the tunnel barrier 20 is formed by first depositing a thin aluminum layer in the range of 6–15 Å thick and subsequently plasma oxidizing this layer in an oxygen plasma to create a layer with the nominal composition of $Al_2O_3$. The soft ferromagnetic layer 32 is formed of 100 Å Co or $Ni_{40}Fe_{60}$. These layers are deposited at room temperature by magnetron sputter deposition, typically at deposition rates of ~2 Å/sec in an argon pressure of ~3 mTorr. Under these conditions, relatively smooth layers are formed which is important to provide a smooth and continuous $Al_2O_3$ tunnel barrier 20 without any pin-holes. The resistance of the tunnel barrier 20 can be varied by many orders of magnitude by varying the thickness of the deposited Al layer and the conditions of oxidation, principally the time of oxidation and the pressure of the oxygen gas in the chamber.

Referring again to FIG. 1, the room temperature resistance versus field curve (FIG. 1C) and corresponding magnetization versus field curve (FIG. 1D) of the hard/soft MTJ device is shown. The hard ferromagnetic layer 18 exhibits a coercivity of ~2000 Oe, which is much higher than the fields to which the MTJ device will be subjected in the operation of the device. The moment of the soft ferromagnetic layer 32 switches in a much lower field than that of the hard ferromagnetic layer of ~80 Oe.

FIGS. 6B–6C show regions of hard high-coercivity ferromagnetic material 60 and 65 situated transverse to the moment of the hard ferromagnetic layer 18 and the direction of the easy axis (arrow 33) of the soft ferromagnetic layer 32 of the MTJ device. These regions 60, 65 are magnetized in a direction 75 to provide a transverse magnetic field bias to the MTJ device to prevent the formation of magnetic domains within the soft ferromagnetic layer 32 when the moment of the soft ferromagnetic layer is rotated or switched from a direction along that of the arrow 33 in FIG. 6B to the opposite direction or vice versa. The transverse biasing ferromagnetic regions 60, 65 are electrically isolated from the MTJ device and from at least one of the electrical leads 11 and 50 by an insulator 40. The insulator can be formed from, for example, $Al_2O_3$ or $SiO_2$. The transverse biasing regions 60, 65 can be formed of various ferromagnetic materials but are preferably formed from a bilayer of a suitable underlayer, such as a nonmagnetic film of Cr or a Cr-V alloy or a Cr-Mn alloy of thickness ~100 Å, and a film of a ferromagnetic alloy of Co-Pt-Cr with high coercivity deposited on the nonmagnetic film. By adjusting the elemental composition of the transverse biasing ferromagnetic layer in regions 60, 65 and the composition of the hard ferromagnetic layer 18 within the MTJ device, the coercivities of the transverse biasing regions 60, 65 and the hard ferromagnetic layer 18 are adjusted to be different from one another. This can also be accomplished by making the transverse biasing regions 60, 65 and the hard ferromagnetic layer 18 from different ferromagnetic alloys with high coercivity. Suitable ferromagnetic alloys include alloys of Co and one or more other elements, including Co-Pt-Cr alloys, Co-Cr-Ta alloys, Co-Cr alloys, Co-Sm alloys, Co-Re alloys, Co-Ru alloys, and Co-Ni-X alloys (X=Pt, Pd, or Cr), as well as a variety of quaternary alloys, such as Co-Ni-Cr-Pt and Co-Pt-Cr-B. The coercivities of the transverse biasing regions 60, 65 and the hard ferromagnetic layer 18 can also be made different, even if they are formed from the same ferromagnetic alloy, by making the layers of different thicknesses or by using underlayers of different thicknesses or underlayers of different compositions. Possible underlayer materials include, in addition to Cr, Cr-V alloys, Ta, Ta-W alloys, Ti-W alloys, W and Mo.

The direction 75 of the magnetic moments of the transverse biasing regions 60, 65 must be set orthogonal to the direction 33 of the magnetic moment of the hard ferromagnetic layer 18. This is most readily accomplished by forming the transverse biasing regions 60, 65 and the hard ferromagnetic layer 18 from different ferromagnetic materials and/or underlayers so that they have different coercivities at room temperature. Thus, the direction of the magnetic moment of the higher coercivity material, whether that of the transverse biasing regions 60, 65, or that of the hard ferromagnetic layer 18, is first fixed by applying a magnetic field sufficiently greater than the coercivity of the higher coercive ferromagnetic material, $H_C^H$. In a second step, the direction of the magnetic moment of the lower coercive ferromagnetic material is fixed by applying a magnetic field of strength lower than $H_C^H$ but greater than the coercive field of the lower coercive ferromagnetic material, $H_C^L$. The direction of the lower coercive ferromagnet is set orthogonal to that of the higher coercive ferromagnet, as shown by arrows 33, 75 in FIG. 6B.

The product M*t (where M is the magnetic moment per unit area of the material in the ferromagnetic layer and t is the thickness of the ferromagnetic layer) of the transverse biasing ferromagnetic regions 60, 65 must be greater than the M*t of the soft ferromagnetic layer 32 to assure stable transverse biasing. Since the magnetic moment of $Ni_{(100-x)}Fe_{(x)}$ (x being approximately 60) that is used in the soft ferromagnetic layer 32 is about three times that of the magnetic moment of a typical hard ferromagnetic material suitable for the transverse biasing ferromagnetic layer, such as $Co_{75}Pt_{13}Cr_{12}$, the thickness of the ferromagnetic layer in the transverse biasing regions 60, 65 should be at least approximately three times the thickness of the soft ferromagnetic layer 32.

The presence of the transverse bias field maintains the symmetry of the hard/soft MTJ memory cell so that the stabilities of the two bit states of the cell (in which the direction of the magnetic moment of the soft ferromagnetic layer 32 is parallel and antiparallel to that of the moment of the fixed ferromagnetic layer 14) are approximately equal. Nevertheless, the transverse bias field provided by the transverse biasing regions 60, 65 affords the coherent rotation of the magnetic moment of the soft ferromagnetic layer 32 without the formation of magnetic domains when suitable switching fields are applied. Thus the magnetization decay of the magnetic moment of the hard ferromagnetic layer is eliminated and the hard ferromagnetic layer will not become demagnetized with repeated cycling of the MTJ device.

When a magnetic field is applied to change the state of the MTJ device by rotating the magnetic moment of the soft ferromagnetic layer from being aligned parallel to the moment of the hard ferromagnetic layer to being aligned antiparallel (or vice-versa) the rotation of the magnetic moment of the soft ferromagnetic layer can be achieved either by the formation of magnetic domains in the soft ferromagnetic layer or by the coherent rotation of the magnetic moment of the soft layer without the formation of magnetic domains. In the former case the magnitude of the magnetic moment of the soft ferromagnetic layer will vary as the magnetic field is applied, i.e., the moment of the soft ferromagnetic layer will become smaller than the moment of the soft ferromagnetic layer when it is largely saturated or magnetized parallel or anti-parallel to the direction indicated by the arrow 33 in FIG. 6B. The net moment of the soft ferromagnetic layer is reduced because of the formation of magnetic domains within this layer. By coherent rotation is meant that the magnitude of magnetic moment of the soft layer is largely unchanged when the magnetic state of the MTJ device is changed by application of a magnetic field. One of the main reasons for the formation of magnetic domains within the soft ferromagnetic layer is that when the shape of the soft ferromagnetic layer is rectangular or symmetric with regard to the direction of the magnetic moment of the hard ferromagnetic layer, the energy for rotation of the magnetic moment within the plane of the MTJ device away from its initial direction either up or down with regard to the direction indicated by the arrow 33 in FIG. 6B is the same. This leads to the formation of magnetic domains. By applying a transverse bias field the symmetry is broken and the moment of the soft ferromagnetic layer rotates largely coherently or largely without the formation of magnetic domains.

While it is possible to apply a transverse magnetic field in conjunction with a longitudinal magnetic field by applying currents to the write and bit lines corresponding to the particular MTJ device, these fields may not be uniform across the MTJ device and it is therefore preferable to apply the transverse bias by using the transverse biasing ferromagnetic regions 60, 65.

The magnitude of the transverse bias field from the transverse biasing ferromagnetic regions 60 and 65 is small compared to the magnitude of the switching field of the soft ferromagnetic layer. The switching field of the soft ferromagnetic layer will be determined in part by the intrinsic coercivity and magnetic anisotropy of the material comprising the soft ferromagnetic layer, as well as the magnetic shape anisotropy of the soft ferromagnetic layer, as well as any magnetic coupling across the tunnel barrier 20 between the soft ferromagnetic layer and the fixed ferromagnetic layer.

Figure 7A:
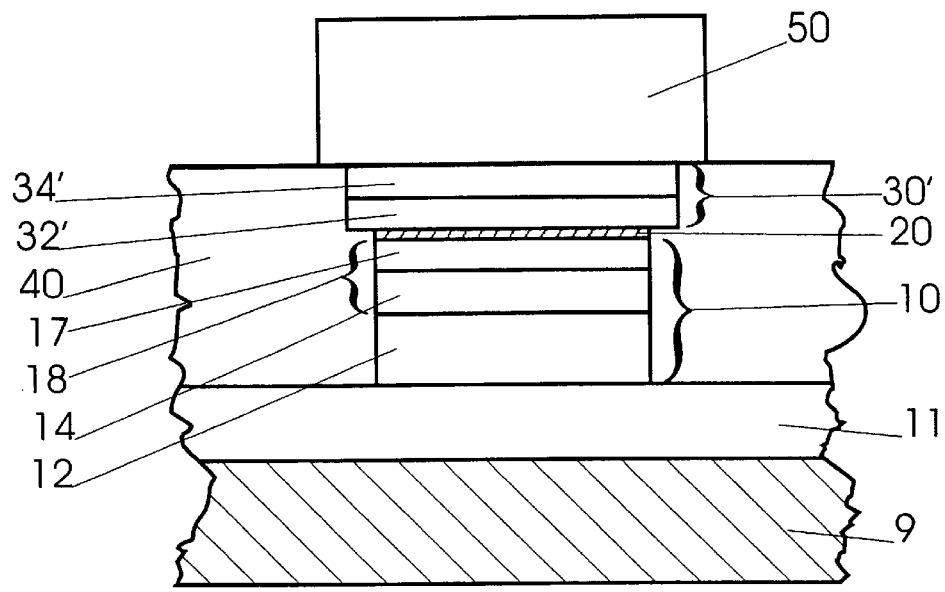
FIGS. 7A–7B show a cross-section view and a top-view, respectively, of a hard/soft MTJ device of the present invention with the top and bottom electrodes having different surface areas.
Figure 7B:
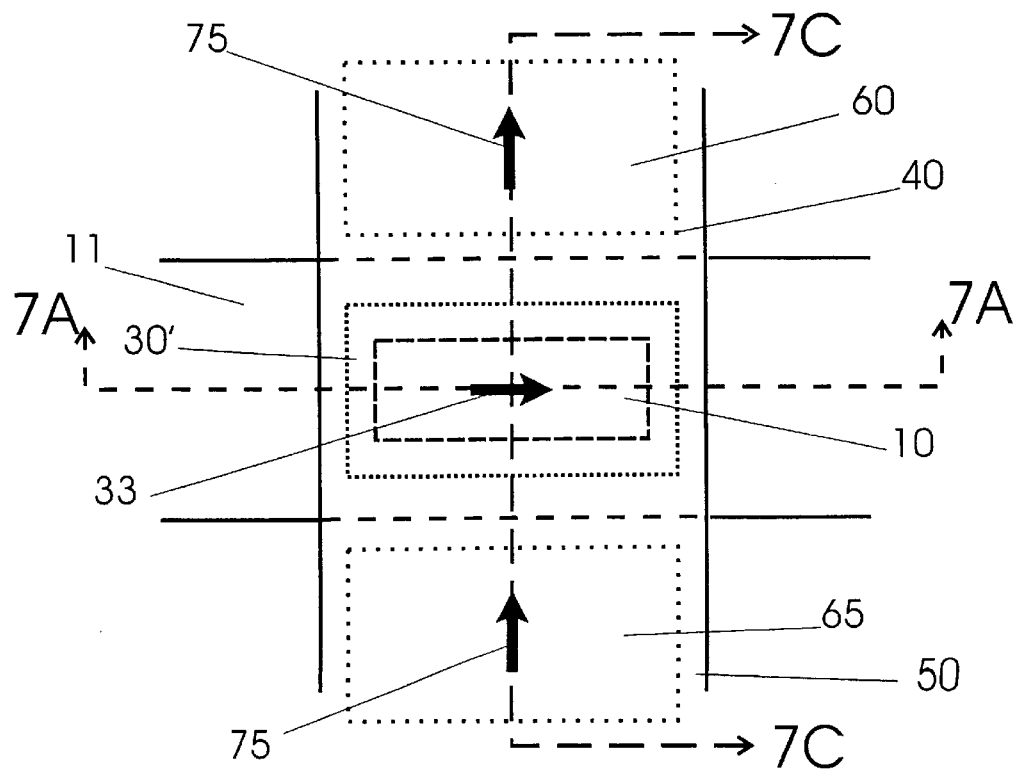
Figure 7C:
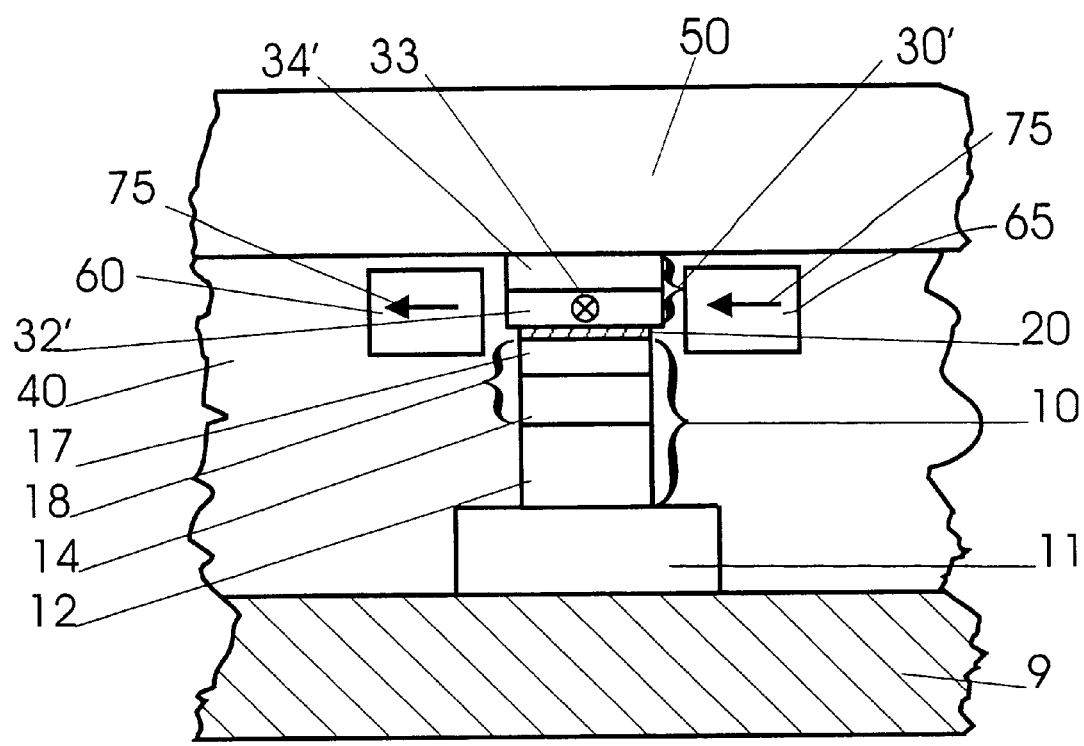
FIG. 7C shows a cross section view of the section 7C—7C taken through FIG. 7B and illustrates the vertical relationship of the transverse biasing ferromagnetic regions electrically isolated from the MTJ and contact leads, where the top and bottom electrodes have different surface areas.

Although in FIG. 6A the sides of the electrode 10 and electrode 30 are shown contiguous with one another, it may be advantageous to allow the soft ferromagnetic layer to have a larger surface area, along either one or both of its edges, than that of the hard ferromagnetic layer. This alternative embodiment of the hard/soft MTJ that eliminates the effect of domains in the soft ferromagnetic layer is shown in FIGS. 7A–7C, wherein the electrode 30' with soft ferromagnetic layer 32' has a larger surface area than electrode 10 with hard ferromagnetic layer 18. Although the bulk of the soft ferromagnetic layer may rotate coherently without the formation of magnetic domains, it is possible that the magnetization of the soft ferromagnetic layer may, for example, be pinned by stress at the edges of the soft ferromagnetic layer. Thus, magnetic domain walls may be formed in the vicinity of the edges of the soft ferromagnetic layer which may cause magnetization decay of the magnetic moment of the hard ferromagnetic layer. This can be avoided by making the area of the soft ferromagnetic layer larger than that of the hard ferromagnetic layer, as shown in FIGS. 7A–7C. In this alternative embodiment it may also be advantageous to additionally include the transverse bias regions 60, 65 as shown in FIGS. 7B–7C.

While the preferred embodiments of the present invention have been illustrated in detail, it should be apparent that modifications and improvements may be made to the invention without departing from the spirit and scope of the invention as described in the following claims.

What is claimed is:

1. A magnetic tunnel junction device for connection to electrical circuitry that detects a change in electrical resistance of the device in the presence of an applied magnetic field, the device comprising:

a hard ferromagnetic layer having a coercivity higher than applied magnetic fields in the range of interest of the device, whereby the hard ferromagnetic layer has a magnetic moment that is fixed in a preferred direction in the presence of an applied magnetic field in the range of interest;

a soft ferromagnetic layer having a coercivity less than the coercivity of the hard ferromagnetic layer and whose magnetic moment is free to rotate in the presence of an applied magnetic field in the range of interest;

an insulating tunneling barrier layer located between and in contact with the hard ferromagnetic layer and the soft ferromagnetic layer for permitting tunneling current in a direction generally perpendicular to the hard ferromagnetic layer and soft ferromagnetic layer;

a biasing ferromagnetic layer having a magnetic moment generally transverse to the magnetic moment of the hard ferromagnetic layer, the biasing ferromagnetic layer having a coercivity different from the coercivity of the hard ferromagnetic layer;

an insulating layer for electrically isolating the biasing ferromagnetic layer from the hard and soft ferromagnetic layers; and a substrate for supporting the hard ferromagnetic layer, tunneling barrier layer, soft ferromagnetic layer, transverse biasing ferromagnetic layer and insulating layer.

2. The magnetic tunnel junction device according to claim 1 wherein the transverse biasing ferromagnetic layer comprises a bilayer of a nonmagnetic film and a ferromagnetic film formed on the nonmagnetic film.

3. The magnetic tunnel junction device according to claim 2 wherein the nonmagnetic film is selected from the group consisting of Cr, a Cr-V alloy and a Cr-Mn alloy.

4. The magnetic tunnel junction device according to claim 2 wherein the ferromagnetic film formed on the nonmagnetic film is an alloy of Co-Pt-Cr.

5. The magnetic tunnel junction device according to claim 1 wherein the transverse biasing ferromagnetic layer and the hard ferromagnetic layer have different material compositions.

6. The magnetic tunnel junction device according to claim 1 wherein the transverse biasing ferromagnetic layer and the hard ferromagnetic layer have the same material compositions but different thicknesses.

7. The magnetic tunnel junction device according to claim 1 further comprising a nonmagnetic underlayer onto which the hard ferromagnetic layer is formed and a nonmagnetic underlayer onto which the transverse biasing ferromagnetic layer is formed.

8. The magnetic tunnel junction device according to claim 7 wherein the transverse biasing ferromagnetic layer and the hard ferromagnetic layer have the same material compositions and wherein the nonmagnetic underlayer onto which the hard ferromagnetic layer is formed has a thickness different from the thickness of the nonmagnetic underlayer onto which the transverse biasing ferromagnetic layer is formed.

9. The magnetic tunnel junction device according to claim 1 wherein the soft ferromagnetic layer has a surface area greater than the surface area of the hard ferromagnetic layer.

10. The magnetic tunnel junction device according to claim 1 wherein M represents magnetic moment per unit area and t represent thickness and wherein M*t of the transverse biasing ferromagnetic layer is greater than M*t of the soft ferromagnetic layer.

11. The magnetic tunnel junction device according to claim 1 wherein the hard ferromagnetic layer comprises a multilayer of a Co interface film in contact with the tunneling barrier layer and a Co-Pt alloy film in contact with the Co interface film.

12. The magnetic tunnel junction device according to claim 1 wherein the material of the soft ferromagnetic layer is selected from the group consisting of Co, alloys of Co, and alloys of Ni-Fe.

13. A hard/soft magnetic tunnel junction memory cell having two magnetic states and usable in a nonvolatile magnetic memory array of memory cells, the array being connected to read/write circuitry for altering and detecting the magnetic state of individual memory cells in the array, the memory cell comprising:

a hard ferromagnetic layer having a coercivity higher than applied magnetic fields in the range of interest of the cell, whereby the hard ferromagnetic layer has a magnetic moment that is fixed in a preferred direction in the presence of an applied magnetic field in the range of interest;

a soft ferromagnetic layer having a coercivity less than the coercivity of the hard ferromagnetic layer and whose magnetic moment is free to rotate between directions generally parallel and antiparallel to the magnetic moment of the hard ferromagnetic layer when exposed to said applied magnetic field;

an insulating tunneling barrier layer located between and in contact with the hard ferromagnetic layer and the soft ferromagnetic layer for permitting tunneling current in a direction generally perpendicular to the hard ferromagnetic layer and soft ferromagnetic layer;

a biasing ferromagnetic layer comprising first and second regions spaced on opposite sides of the soft ferromagnetic layer, the regions having magnetic moments generally transverse to the magnetic moment of the hard ferromagnetic layer, the biasing ferromagnetic layer having a coercivity different from the coercivity of the hard ferromagnetic layer;

an insulating layer located between the transverse biasing regions and the hard and soft ferromagnetic layers for electrically isolating the transverse biasing regions from the hard and soft ferromagnetic layers; and a substrate for supporting the hard ferromagnetic layer, tunneling barrier layer, soft ferromagnetic layer, transverse biasing regions and insulating layer; whereby when the hard ferromagnetic layer and the soft ferromagnetic layer are connected to the read/write circuitry, the electrical resistance to current flow through the insulating tunnel barrier layer in a direction generally perpendicular to the hard ferromagnetic layer and the soft ferromagnetic layer is determined by said parallel or antiparallel magnetic moment of said soft ferromagnetic layer, the value of said electrical resistance thereby allowing the magnetic state of the memory cell to be determined.

14. The magnetic tunnel junction memory cell according to claim 13 wherein the transverse biasing ferromagnetic layer comprises a bilayer of a nonmagnetic film and a ferromagnetic film formed on the nonmagnetic film.

15. The magnetic tunnel junction memory cell according to claim 14 wherein the nonmagnetic film is selected from the group consisting of Cr, a Cr-V alloy and a Cr-Mn alloy.

16. The magnetic tunnel junction memory cell according to claim 14 wherein the ferromagnetic film formed on the nonmagnetic film is an alloy of Co-Pt-Cr.

17. The magnetic tunnel junction memory cell according to claim 13 wherein the transverse biasing ferromagnetic layer and the hard ferromagnetic layer have different material compositions.

18. The magnetic tunnel junction memory cell according to claim 13 wherein the transverse biasing ferromagnetic layer and the hard ferromagnetic layer have the same material compositions but different thicknesses.

19. The magnetic tunnel junction memory cell according to claim 13 further comprising a nonmagnetic underlayer onto which the hard ferromagnetic layer is formed and a nonmagnetic underlayer onto which the transverse biasing ferromagnetic layer is formed.

20. The magnetic tunnel junction memory cell according to claim 19 wherein the transverse biasing ferromagnetic layer and the hard ferromagnetic layer have the same material compositions and wherein the nonmagnetic underlayer onto which the hard ferromagnetic layer is formed has a thickness different from the thickness of the nonmagnetic underlayer onto which the transverse biasing ferromagnetic layer is formed.

21. The magnetic tunnel junction memory cell according to claim 13 wherein the soft ferromagnetic layer has a surface area greater than the surface area of the hard ferromagnetic layer.

22. The magnetic tunnel junction memory cell according to claim 13 wherein M represents magnetic moment per unit area and t represent thickness and wherein M*t of the transverse biasing ferromagnetic layer is greater than or equal to M*t of the soft ferromagnetic layer.

23. The magnetic tunnel junction memory cell according to claim 13 wherein the hard ferromagnetic layer comprises a multilayer of a Co interface film in contact with the tunneling barrier layer and a Co-Pt alloy film in contact with the Co interface film.

24. The magnetic tunnel junction memory cell according to claim 13 wherein the material of the soft ferromagnetic layer is selected from the group consisting of Co, alloys of Co, and alloys of Ni-Fe.

* * * * *